(12) United States Patent
Poulsen

(10) Patent No.: US 6,538,972 B1
(45) Date of Patent: Mar. 25, 2003

(54) NON-MARRING EJECTOR MECHANISM

(75) Inventor: Andrew S. Poulsen, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 315 days.

(21) Appl. No.: 09/624,791

(22) Filed: Jul. 25, 2000

(51) Int. Cl.⁷ .......................... G11B 33/02; H05K 5/00; H05K 7/00; G06F 1/16
(52) U.S. Cl. ...................... 369/77.2; 361/685
(58) Field of Search ................. 312/8.1, 8.2, 8.3, 312/8.4, 8.5, 8.6, 8.7, 8.8, 8.9, 8.11, 8.12, 8.13, 8.14, 8.15, 8.16; 361/685; 360/97.01, 97.02, 97.03, 97.04; 369/75.1, 75.2, 77.1, 77.2

(56) References Cited

U.S. PATENT DOCUMENTS

| | | | | | |
|---|---|---|---|---|---|
| 4,152,038 | A | * | 5/1979 | Inouye et al. ............... | 439/153 |
| 4,982,303 | A | * | 1/1991 | Krenz ........................ | 292/199 |
| 5,010,426 | A | * | 4/1991 | Krenz ........................ | 360/137 |
| 5,260,925 | A | * | 11/1993 | Camps et al. ............... | 369/243 |
| 5,682,371 | A | * | 10/1997 | Park .......................... | 369/191 |
| 5,721,669 | A | * | 2/1998 | Becker et al. ............... | 361/685 |
| 6,411,505 | B1 | * | 6/2002 | DiFonzo et al. ............ | 361/683 |

* cited by examiner

Primary Examiner—Brian E. Miller
Assistant Examiner—Julie Anne Watko

(57) ABSTRACT

A non-marring ejector mechanism for aiding a separation of a first component from a second component comprises an arm moveably mounted to the first component so that the arm is moveable between an extended position and a retracted position. A wheel mounted for rotation on the arm rolls along a contact surface provided on the second component as the arm is moved from the retracted position to the extended position. The wheel provides a disengagement force to the first and second components aiding in their disengagement.

20 Claims, 5 Drawing Sheets

NON-MARRING EJECTOR MECHANISM

FIELD OF INVENTION

This invention relates to ejection mechanisms in general and more specifically to an ejection device for aiding in the separation of a removable electronic component from a main chassis.

BACKGROUND

Various types of ejection mechanisms are known in the art and have been used to secure together mating components to allow one component to be disengaged or ejected from the other. Depending on the nature of the ejector mechanism that may be used in a particular application, a separate latch device or mechanism may be used to aid in securing together the two mating components. A common example of a latch and ejector mechanisms may be found in cassette tape players, in which a latch mechanism may be used to hold the cassette tape in the player. An ejector mechanism may be used to release the latch mechanism and eject the tape from the player. Of course, this is only one example. Many other types of latch/ejector mechanisms are known in the art and have been used on a wide variety of devices in a wide range of applications.

A common ejector mechanism utilizes a cam-type arrangement to push apart the two mating components. The cam action provided by the mechanism results in a wiping or rubbing of the ejector mechanism on one or both of the mating components. This wiping or rubbing can, and often does, mar or blemish the surface or surfaces of the mating components. Such marring or blemishing of the surfaces can be a disadvantage, particularly if the surfaces involved are "cosmetic," i.e., intended to be visible during normal operation of the device.

Partly in an effort to avoid the problem of marring or blemishing the surfaces of the mating components, ejector mechanisms have been developed which utilize linear actuators. In most applications, such linear actuators may be used to eject or separate the mating components while minimizing the likelihood that the actuators will mar or otherwise blemish the surfaces of the mating components. Unfortunately, however, such linear actuator type ejector mechanisms are often relatively complex and may require a relatively large amount of space.

Consequently, a need remains for an ejector mechanism for aiding in the ejection or separation of mating components that minimizes the likelihood that one or more of the surfaces of the mating components will be marred or blemished by the action of the ejector mechanism. Additional advantages could be achieved if such a non-marring ejector mechanism would involve a relatively simple and compact device.

SUMMARY OF THE INVENTION

A non-marring ejector mechanism for aiding a separation of a first component from a second component may comprise an arm moveably mounted to the first component so that the arm is moveable between an extended position and a retracted position. A wheel mounted for rotation on the arm rolls along a contact surface provided on the second component as the arm is moved from the retracted position to the extended position. The wheel provides a disengagement force to the first and second components aiding in their disengagement.

Also disclosed is a method for separating the first and second components that comprises the steps of: Providing the first component with a wheel that is moveable with respect to the first component between a retracted position and an extended position; and moving the wheel to the extended position. The wheel contacts the second component as the wheel is moved to the extended position thereby assisting in the separation of the first and second components.

BRIEF DESCRIPTION OF THE DRAWING

Illustrative and presently preferred embodiments of the invention are shown in the accompanying drawing in which.

DETAILED DESCRIPTION OF THE INVENTION

Figure 1:
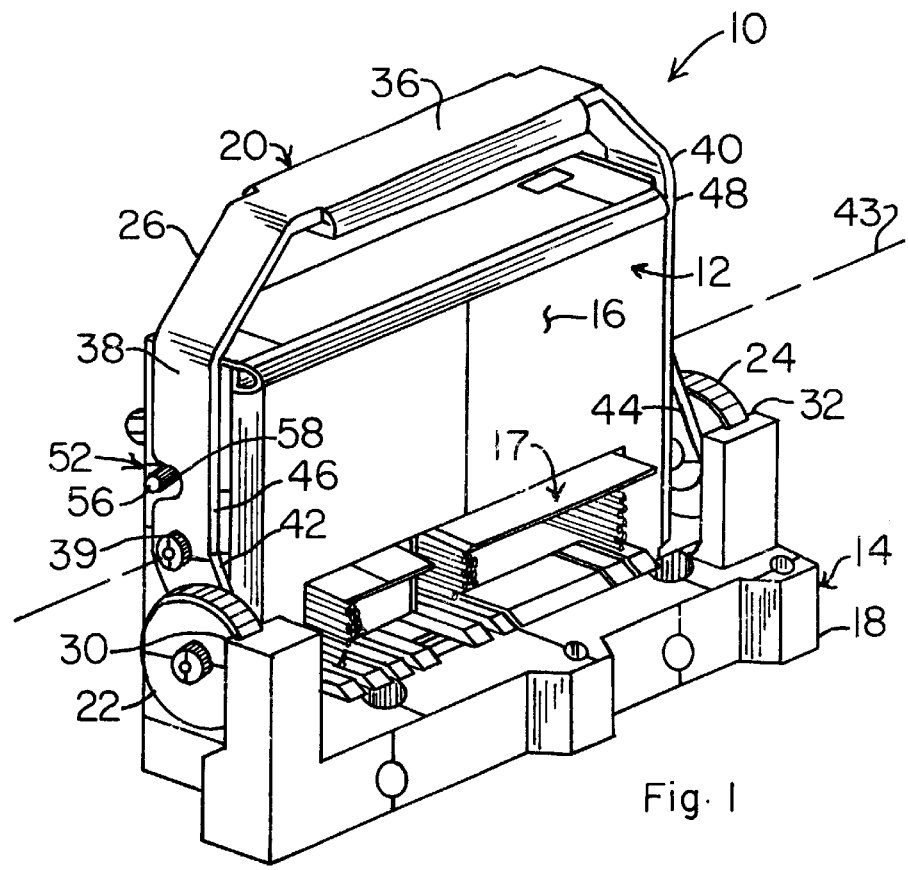
FIG. 1 is a perspective view of one embodiment of a non-marring ejector mechanism showing the first and second components in the engaged position.

A non-marring ejector mechanism 10 according to one preferred embodiment of the present invention is shown and described herein as it could be used to aid in the separation of a first component 12 from a second component 14. By way of example, the first component 12 may comprise an electronic interface assembly 16, whereas the second component 14 may comprise a main chassis 18 for housing a host electronic system or device (not shown). Alternatively, the first and second mating components 14 and 16 may comprise any of a wide range of other devices that are designed to be releasably engagable with one another.

Figure 2:
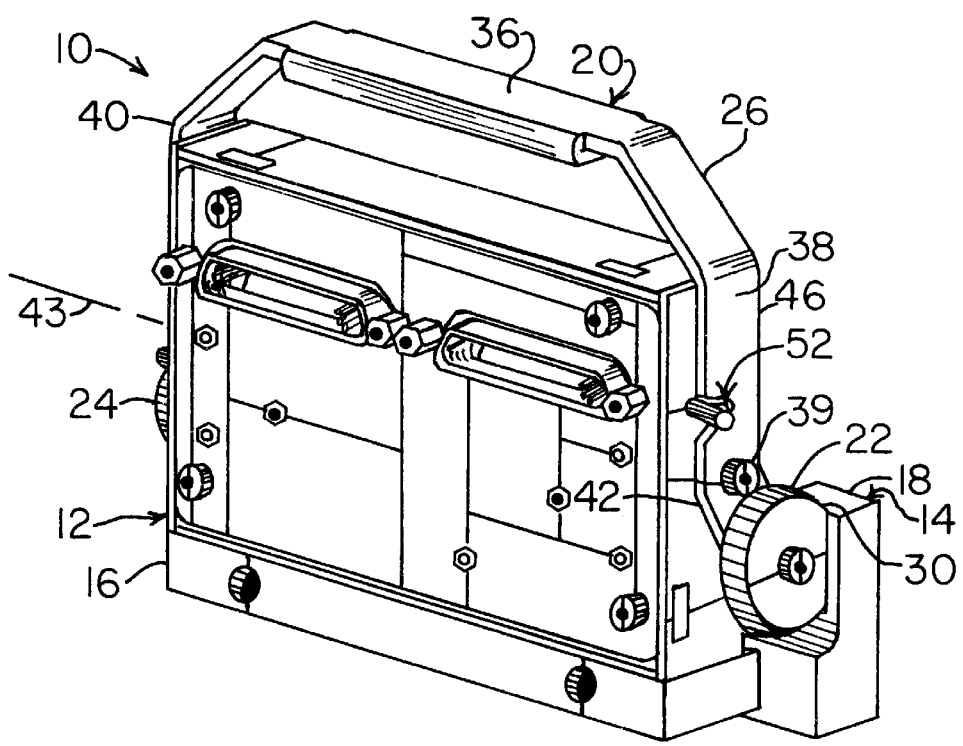
FIG. 2 is a perspective view of the front side of the first component to which is mounted the non-marring ejector mechanism.
Figure 3:
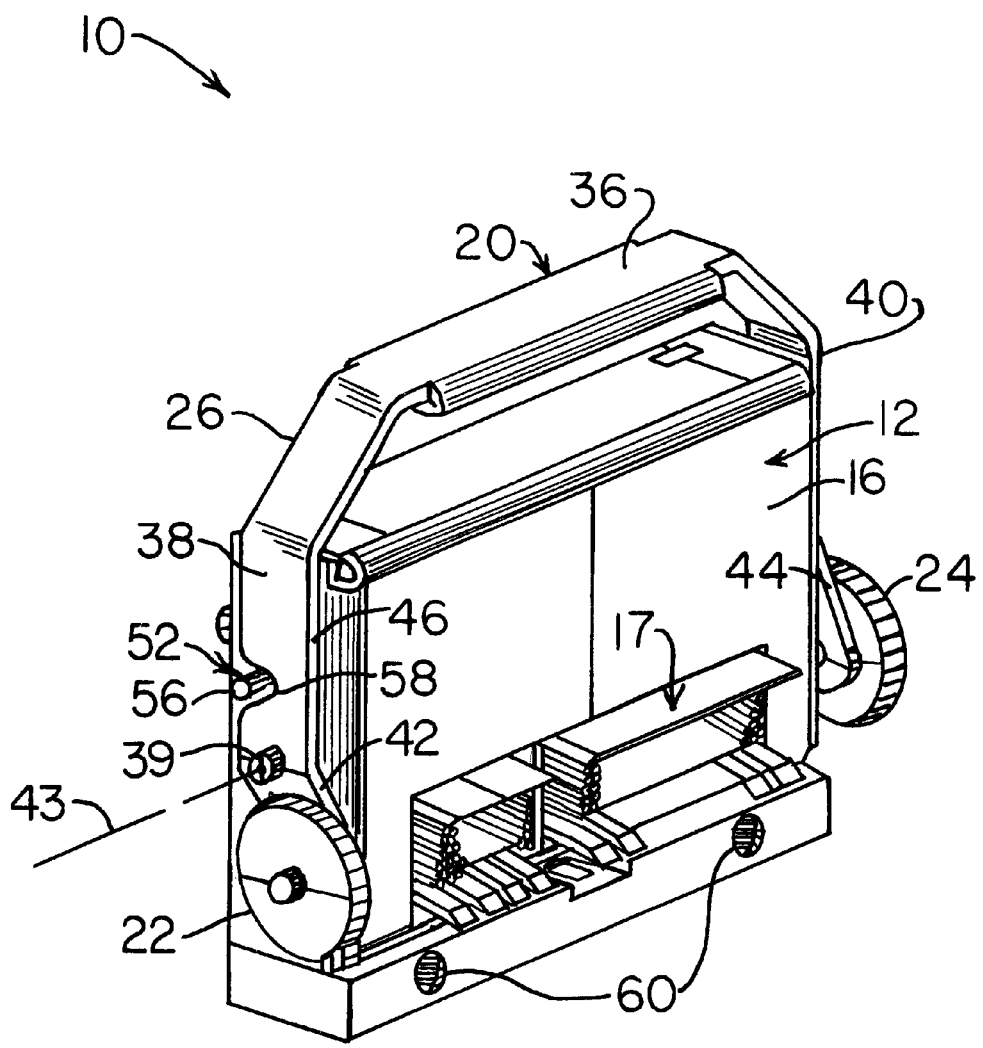
FIG. 3 is a perspective view of the non-marring ejector mechanism and first component with the second mating component removed.
Figure 4:
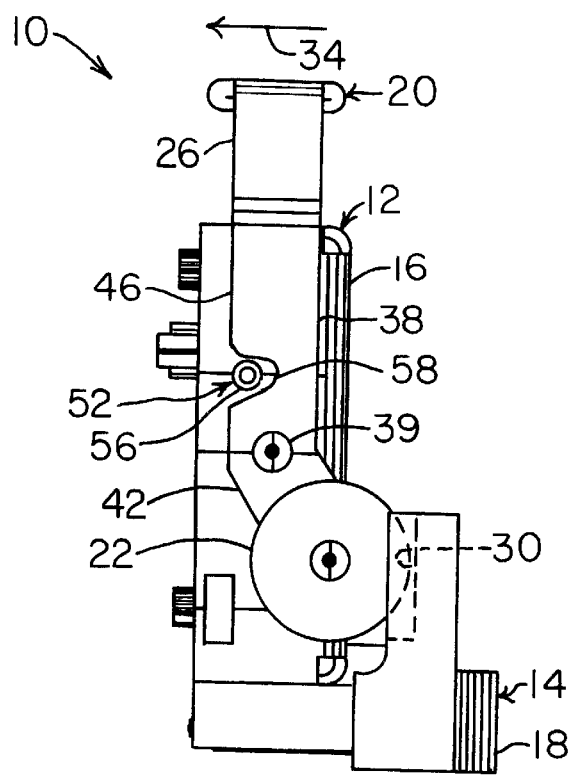
FIG. 4 is a right side view in elevation of the non-marring ejector mechanism with the second component in the engaged position and the wheel assembly in the retracted position.
Figure 5:
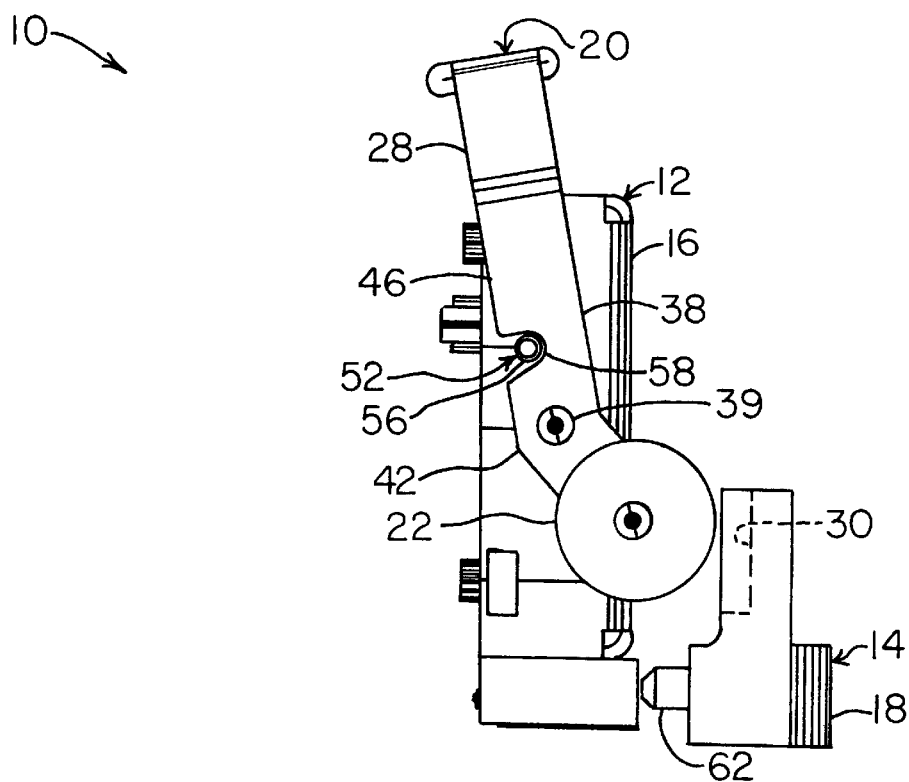
FIG. 5 is a right side view in elevation of the non-marring ejector mechanism with the second component in the disengaged position and the wheel assembly in the extended position.
Figure 6:
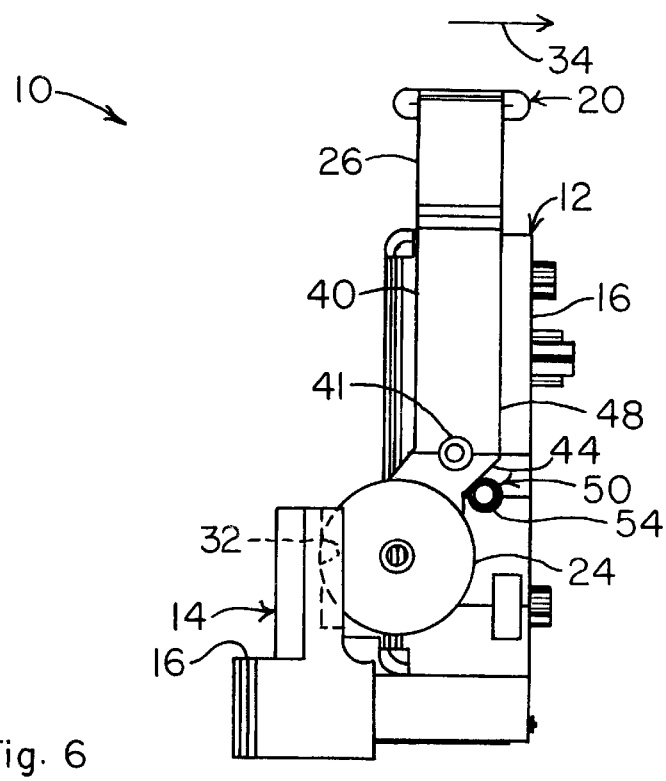
FIG. 6 is a left side view in elevation of the non-marring ejector mechanism with the second component in the engaged position and the wheel assembly in the retracted position.
Figure 7:
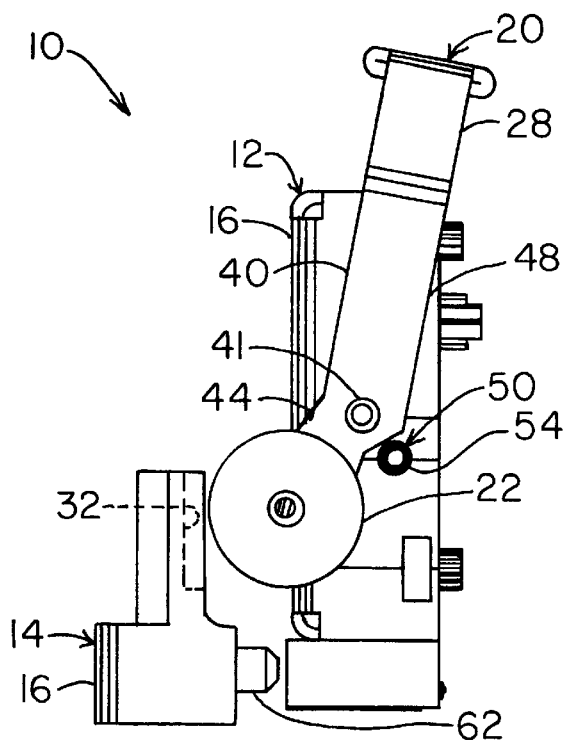
FIG. 7 is a left side view in elevation of the non-marring ejector mechanism with the second component in the disengaged position and the wheel assembly in the extended position.

Referring now primarily to FIGS. 1 and 2, one embodiment of the non-marring ejector mechanism 10 according to the present invention may comprise a generally U-shaped member 20 that is mounted to the first component 12 so that a pair of wheels 22, 24 mounted to the U-shaped member 20 may be moved between a retracted position 26 (illustrated in FIGS. 1–4 and 6) and an extended position 28 (illustrated in FIGS. 5 and 7). The wheels 22, 24 are positioned so that they may be placed in contact with respective contact surfaces 30, 32 provided on the second component 14 by moving the U-shaped member 20.

The non-marring ejector mechanism 10 may be operated as follows to assist in the separation or disengagement of the first and second components 12 and 14. Consider, for example, an initial position wherein the first and second components 12 and 14 are mated together (i.e., engaged), as illustrated in FIGS. 1, 2, 4, and 6). When the two components 12 and 14 are so engaged, the U-shaped member 20 and the wheels 22, 24 are in the retracted position 26. See FIGS. 1 and 2. In this retracted position, the wheels 22 and 24 may be positioned closely adjacent the respective contact surfaces 30 and 32. Alternatively, the wheels 22 and 24 may be lightly contacting the respective contact surfaces 30 and 32. In order to separate or disengage the first component 12 from the second component 14, a user (not shown) would grasp the U-shaped member 20 and pull it in the direction indicated generally by arrow 34 (FIG. 4). So moving the U-shaped member 20 causes the wheels 22, 24 to move toward the extended position 28, as best seen in FIGS. 5 and 7. As the wheels 22, 24 are moved to the extended position 28, they push against the respective contact surfaces 30 and 32 provided on the chassis 18 of second component 14, thereby urging apart or separating the first component 12 from the second component 14. As the first component 12 is disengaged from the second component 14, the first and second wheels 22 and 24 roll along the contact surfaces 30 and 32 provided on the chassis 18 of the second component 14, thereby minimizing the likelihood that the contact surfaces 30 and 32 will be marred as a result of the wheels 22, 24 providing the disengagement force.

A significant advantage of the non-marring ejector mechanism 10 is that it provides an ejection or separation force to release or separate mating component assemblies while at the same time minimizing the likelihood that the surfaces of the mating components will be marred or otherwise blemished by the operation of the ejector mechanism 10. Consequently, the present invention is particularly advantageous in those applications wherein the mating components comprise cosmetic or finished surfaces intended to be visible during the normal use of the product. The present invention would also be advantageous in other applications wherein it would be undesirable for the ejector mechanism to mark or scratch the surfaces of the mating components.

Another advantage of the present invention is that it provides the non-marring feature, but without the mechanical complexity often associated with linear motion type ejector mechanisms. Still yet another advantage of the present invention is that the U-shaped member 20 provides a visual indication of the status of the engagement of the components, thereby allowing a user to readily visually discern the degree of engagement of the two components 12, 14, i.e., whether the first and second components 12 and 14 are disengaged, partially engaged, or fully engaged.

Having briefly described one embodiment of the non-marring ejector mechanism 10 according to the present invention, as well as some of its more significant features and advantages, the various embodiments of the non-marring ejector mechanism according to the present invention will now be described in detail. However, before proceeding with the description, it should be noted that while the non-marring ejector mechanism 10 is shown and described herein as it could be used with an electronic interface assembly 16 that is releasably engagable with a chassis 18 associated with host electronic assembly (not shown), the present invention could be used with any other type of system or device wherein it is desired to have the ejector mechanism assist in the disengagement of the mating components comprising the system or device. Consequently, the present invention should not be regarded as limited to use with the particular components shown and described herein.

Referring back now to FIGS. 1–3 simultaneously, the non-marring ejector mechanism 10 according to one embodiment may be used to aid in the separation of a first component 12 from a second component 14. In the embodiment shown and described herein, the first component 12 may comprise a removable electronic interface assembly 16 of any type that is commonly used in the art or that may be developed in the future. The second component 14 may comprise all or a portion of a chassis 18 associated with an electronic circuit or device (not shown) to which may be connected the removable electronic interface assembly 16. The removable electronic interface assembly 16 may be provided with a pin-type connector 17 sized to engage a mating connector (not shown) provided on the second component 14. The pin-type connector 17 electrically connects the removable electronic interface assembly 16 with the electronic circuit or device (not shown) that may comprise the second component 14. However, since the particular nature and functionality of the first and second components 12 and 14 are not necessary to understand or practice the invention, the nature and functionality of the first and second components 12 and 14 that may be utilized in one preferred embodiment of the present invention will not be discussed in further detail herein.

The non-marring ejector mechanism 10 may comprise a generally U-shaped member 20 that is mounted to the first component 12 so that a pair of wheels 22, 24 mounted to the U-shaped member 20 may be moved between a retracted position 26 (illustrated in FIGS. 1–4 and 6) and an extended position 28 (illustrated in FIGS. 5 and 7). More specifically, the U-shaped member 20 defines a handle portion 36 and two leg portions 38, 40 which are positioned in generally parallel, spaced-apart relation.

The first and second leg portions 38 and 40 are pivotally mounted to the first component 12 via respective first and second pivot pins 39 and 41 so that the U-shaped member 20 may be rotated about pivot axis 43. The first and second pivot pins 39 and 41 divide the first and second leg portions 38 and 40 into respective first and second arm portions 42 and 44 and first and second lever portions 46 and 48.

The U-shaped member 20 may be fabricated from any of a wide range of materials, such as metals or plastics, suitable for the intended application. Consequently, the present invention should not be regarded as limited to a U-shaped member 20 fabricated from any particular material. By way of example, in one preferred embodiment, the U-shaped member 20 is fabricated from an aluminum alloy.

The first wheel 22 is mounted for rotation on the first arm portion 42 of the U-shaped member 20 in the manner best seen in FIGS. 1–5. Similarly, the second wheel 24 is mounted for rotation on the second arm portion 44 of the U-shaped member 20, as best seen in FIGS. 6 and 7. The wheels 22, 24 are free to rotate with respect to their respective arm portions 42, 44 30 that each wheel 22, 24 turns or rotates along its respective contact surface 30, 32 as the handle portion 38 of U-shaped member 20 is moved in the direction of arrow 34.

The wheels 22, 24 may be made from any of a wide range of materials, such as metals or plastics, suitable for the intended application and suitable for minimizing the likelihood that the rotation of the wheels 22, 24 will mar or otherwise blemish their respective contact surfaces 30, 32. By way of example, in the embodiment shown and described herein, the wheels 22, 24 are fabricated from Delrin®. Alternatively, other materials, such as Nylon®, urethane, or rubber, could be used, as would be obvious to persons having ordinary skill in the art after having become familiar with the teachings of the present invention.

The U-shaped member 20 may be pivoted about axis 43 (FIGS. 1–3) so that the wheels 22, 24 may be moved from a retracted position 26 (illustrated in FIGS. 1–4 and 6) to an extended position 28 (illustrated in FIGS. 5 and 7) by moving the handle portion 36 of the U-shaped member 20 in the direction indicated by arrow 34 (FIGS. 4 and 6). It is generally preferred, but not required, to provide the non-marring ejector mechanism 10 with a retraction stop 50 (FIGS. 6 and 7) to prevent the wheels 22, 24 from being retracted beyond the retracted position 26. Similarly, the non-marring ejector mechanism 10 may be provided with an extension stop 52 (FIGS. 1–5) to prevent the wheels 22, 24 from being extended beyond the extended position 28.

In the embodiment shown and described herein, the retraction stop 50 may comprise a pin 54 mounted to the first component 12 so that the pin 54 contacts the second arm portion 44 of the U-shaped member 20 when the U-shaped member 20 is moved beyond the retracted position 26. The engagement of the pin 54 with the second arm portion 44 of the U-shaped member 20 prevents the wheels 22, 24 from being retracted beyond the retracted position 26. The extension stop 52 may comprise a pin 56 mounted to the first component 12 that is sized to engage a slot 58 provided in the first arm portion 42 of the U-shaped member 20. The engagement of the pin 56 in the slot 58 prevents the U-shaped member 20, thus wheels 22, 24, from being moved beyond the extended position 28.

To ensure the easy fast alignment and engagement of the first component 12 with the second component 14, it is generally preferred, but not required, to provide the first component 12 with one or more alignment holes 60 (FIG. 3) that are sized to engage corresponding alignment pins 60 (FIGS. 5 and 7) provided on the second component 14. In another arrangement, the alignment holes 20 may be provided on the second component 14 with the alignment pins 62 provided on the first component. Still other arrangements are possible, as would be obvious to persons having ordinary skill in the art after having become familiar with the teachings of the present invention.

The second component 14 may be provided with a chassis portion 18 that is sized to receive the first component 12. The chassis portion 18 of the second component 14 may be provided with a pair of contact surfaces 30 and 32 positioned so that the contact surfaces 30, 32 are positioned adjacent the wheels 22, 24, respectively, when the first component 12 is engaged with the second component 14. See FIGS. 1, 2, 4, and 6. In the embodiment shown and described herein, the contact surfaces 30 and 32 comprise respective recessed portions of the chassis 18. However, the contact surfaces 30 and 32 need not be recessed but could instead comprise surfaces that are flush with respect to the chassis portion 18 of second component 14.

The non-marring ejector mechanism 10 may be operated as follows to aid in the disengagement of the first component 12 from the second component 14. Assuming that the first component 12 is fully engaged with the second component 14, the wheels 22, 24 will be in the fully retracted position 26 and the handle portion 36 of the U-shaped member 20 will be substantially vertically aligned, as best seen in FIGS. 1–4 and 6. In this retracted position 26, the wheels 22 and 24 may be positioned closely adjacent the respective contact surfaces 30 and 32 provided on the chassis 18 of the second component 14. Alternatively, the wheels 22 and 24 may be lightly contacting the respective contact surfaces 30 and 32. The vertical alignment of the U-shaped member 20 and handle portion 36 while in the retracted position 26 provides the user (not shown) with a visual indication that the first and second components 12 and 14 are fully engaged with one another.

If it is desired to disengage and remove the first component 12 from the second component 14, the user would grasp the handle portion 36 of U-shaped member 20 and move it in the direction indicated by arrow 34 (FIGS. 4 and 6). Moving the U-shaped member 20 in the direction of arrow 34 causes the wheels 22, 24 to move toward the extended position 28, as best seen in FIGS. 5 and 7. As the wheels 22, 24 are moved to the extended position 28, they push against their respective contact surfaces 30 and 32, thereby urging apart or separating the first component 12 from the second component 14. As the first device 12 is disengaged from the second device 14, the first and second wheels 22 and 24 roll along the contact surfaces 30 and 32, thereby minimizing the likelihood that the contact surfaces 30 and 32 will be marred as a result of the wheels 22, 24 providing the disengagement force.

The first and second components 12 and 14 may be engaged by first aligning the first component 12 with the second component 14 so that any engaging elements (e.g., the pin type connector 17) are properly aligned. Proper alignment can be assisted by utilizing the optional alignment pins 62 and holes 60. That is, the first component 12 may be aligned with the second component 14 by aligning the pins 62 with the holes 60. The first component 12 may then be moved toward the second component 14. As the first and second components 12 and 14 are moved together, the wheels 22, 24 on the non-marring ejector mechanism 10 will contact their respective contact surfaces 30, 32 on the chassis 18 provided on the second component 14. As the devices 12 and 14 are further engaged, the wheels 22, 24 and, consequently, the U-shaped member 20, will begin to move toward the retracted position 26. Only when the first and second components 12 and 14 are fully engaged will the U-shaped member 20 be substantially vertically aligned, as best seen in FIGS. 4 and 6). Consequently, the U-shaped member 20 provides a visual indication of the degree of engagement of the first and second devices 12 and 14. If the components 12 and 14 are only partially engaged, the U-shaped member 20 will not be substantially vertically aligned, thereby indicating to the user that the devices are not fully engaged. The user would then continue to push together the first and second components 12 and 14 until the U-shaped member 20 is substantially vertically aligned, indicating full engagement of the components 12 and 14.

Figure 8:
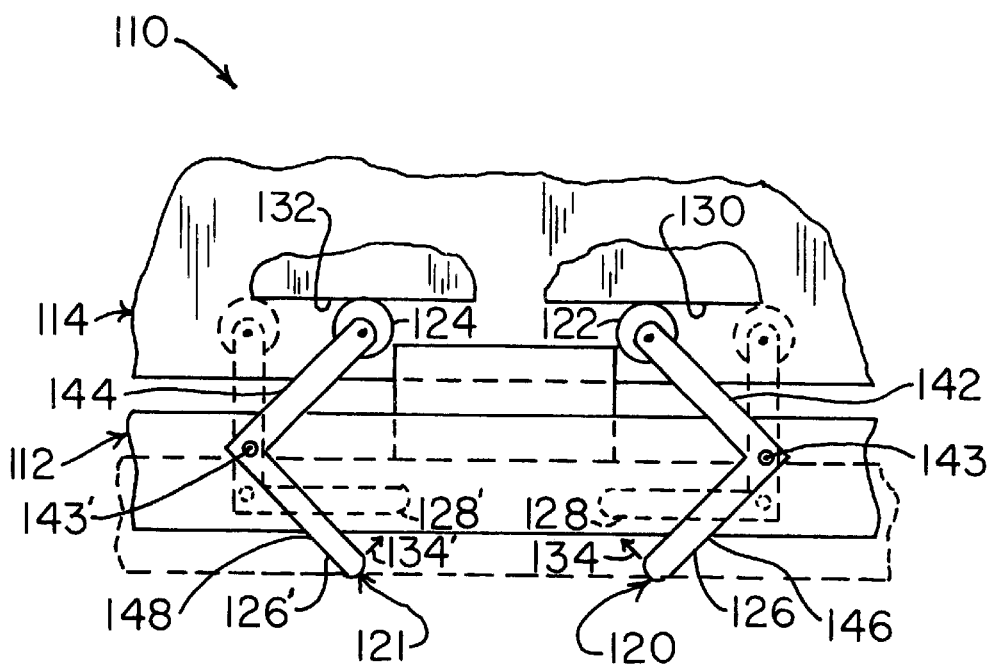
FIG. 8 is a plan view of a second embodiment of a non-marring ejector mechanism according to the present invention. 4

A second embodiment 110 of a non-marring ejector mechanism according to the present invention is shown in FIG. 8. The second embodiment 110 may comprise first and second L-shaped members 120 and 121 that are pivotally mounted to a first component 112 so that wheels 122, 124 rotatably mounted to the first and second L-shaped members 120 and 121, respectively, may be moved between respective retracted positions 126, 126' and extended positions 128, 128'. The wheels 122, 124 engage respective contact surfaces 130 and 132 provided on the second component 114 to assist in the separation or disengagement of the first component 112 from the second component 114.

In the embodiment shown in FIG. 8, L-shaped member 120 may comprise an arm section 142 and a lever section 146. The wheel 122 is rotatably mounted to the arm section 142 so that the wheel 122 is positioned adjacent the contact surface 130 when the first and second components 112, 114 are engaged. The L-shaped member 120 is pivotally mounted to the first component 114 so that L-shaped member 120 may be pivoted about pivot axis 143 to move the arm section 142, thus wheel 122, between the retracted position 126 and the extended position 128. L-shaped member 121 is similar to L-shaped member 120 described above and may comprise an arm section 144 and a lever section 148. The wheel 124 is rotatably mounted to the arm section 144 so that the wheel 124 is positioned adjacent the contact surface 132 provided on the second component 114 when the first component 112 is engaged with the second component 114. The second L-shaped member 121 is pivotally mounted to the first component 114 so that the L-shaped member 121 may be pivoted about pivot axis 143'. Pivoting the L-shaped member 121 about the pivot axis 143' moves the arm section 144, thus wheel 124, between the retracted position 126' and the extended position 128'.

The second embodiment 110 of the non-marring ejector mechanism may be used to aid in the disengagement of the first component 112 from the second component 114 by moving the lever sections 146, 148 of respective L-shaped members 120, 121 in the directions indicated by arrows 134, 134'. So moving the lever sections 146 and 148 of respective L-shaped members 120 and 121 causes the wheels 122 and 124 to move toward their respective extended positions 128 and 128'. As the wheels 122, 124 move toward their extended positions 128, 128', they push against their respective contact surfaces 130, 132 provided on the second component 114, thereby urging apart or separating the first component 112 from the second component 114.

It is contemplated that the inventive concepts herein described may be variously otherwise embodied and it is intended that the appended claims be construed to include alternative embodiments of the invention except insofar as limited by the prior art.

What is claimed is:

1. A non-marring ejector mechanism for aiding a separation of a first component from a second component, comprising:
    a first arm moveably mounted to the first component so that said first arm is moveable between an extended position and a retracted position;
    a first wheel mounted for rotation on said first arm; and
    a first contact surface provided on the second component, said first wheel rolling along said first contact surface and separating the first component from the second component as said first arm is moved to the extended position.

2. The non-marring ejector mechanism of claim 1, further comprising a lever operatively associated with said first arm, said lever moving said first arm between the extended position and the retracted position.

3. The non-marring ejector mechanism of claim 2, wherein said first arm is pivotally mounted to the first component and wherein said lever pivots said first arm to move said first arm between the extended position and the retracted position.

4. The non-marring ejector mechanism of claim 1, further comprising:
    a second arm moveably mounted to the first component so that said second arm is moveable between an extended position and a retracted position;
    a second wheel mounted for rotation on said second arm; and
    a second contact surface provided on the second component, said first and second wheels rolling along said first and second contact surfaces and separating the first component from the second component as said first and second arms are moved to the extended position.

5. The non-marring ejector mechanism of claim 4, further comprising a lever operatively associated with said first and second arms for moving said first and second arms between the extended and retracted positions.

6. The non-marring ejector mechanism of claim 5, further comprising an extension stop mounted to the first component, said extension stop engaging said lever when said first and second arms are in the extended positions, the engagement of said lever with said extension stop preventing said first and second arms from being moved beyond the extended position.

7. The non-marring ejector mechanism of claim 5, further comprising a retraction stop mounted to the first component, said retraction stop engaging said lever when said first and second arms are in the retracted positions, the engagement of said lever with said retraction stop preventing said first and second arms from being moved beyond the retracted position.

8. The non-marring ejector mechanism of claim 5, wherein said first and second wheels are mounted to said first and second arms so that said first and second wheels are positioned in generally aligned, spaced-apart relation to one another.

9. The non-marring ejector mechanism of claim 5, wherein said first and second arms are pivotally mounted to the first component, said lever pivotally moving said first and second arms together between the extended and retracted positions.

10. A non-marring ejector mechanism for aiding in a disengagement of a first component from a second component, comprising:
    a generally U-shaped member defining first and second leg portions and a handle portion, the first and second leg portions being positioned in generally parallel, spaced-apart relation and having respective distal ends and proximal ends, the handle portion connecting the proximal ends of the first and second leg portions, the first and second leg portions of said generally U-shaped lever being pivotally mounted to the first component so that respective first and second arm portions are defined at distal ends of the first and second leg portions and so that first and second lever portions are defined at the proximal ends of the first and second leg portions;
    a first wheel mounted for rotation on the first arm portion of said generally U-shaped member;
    a second wheel mounted for rotation on the second arm portion of said generally U-shaped member; p1 a first contact surface provided on the second component; and
    a second contact surface provided on the second component, said first and second wheels rolling along said first and second contact surfaces and urging apart the first component from the second component as said U-shaped member is pivoted to move the first and second arm portions to an extended position.

11. A non-marring ejector mechanism for aiding a separation of a first component from a second component, comprising:
    a wheel;
    wheel mounting means mounted to the first component for receiving said wheel and for moving said wheel between an extended position and a retracted position; and contact surface means provided on the second component for providing a surface engagable by said wheel and for allowing said wheel to separate the first component from the second component as said wheel is moved to the extended position.

12. The non-marring ejector mechanism of claim 11, further comprising:

extension stop means mounted to the first component for preventing said wheel mounting means from being moved beyond the extended position; and retraction stop means mounted to the first component for preventing said wheel mounting means from being moved beyond the retracted position.

13. An assembly, comprising:

a first component;

a second component sized to releasably engage said first component;

a first arm mounted to said first component, said arm being moveable between an extended position and a retracted position;

a first wheel mounted for rotation on said first arm;

a first contact surface provided on the second component, said first wheel rolling along said first contact surface and separating the first component and the second component as said first arm is moved to the extended position.

14. The assembly of claim 13, further comprising a lever operatively associated with said first arm, said lever moving said first arm between the extend position and the retracted position.

15. The assembly of claim 14, wherein said first arm is pivotally mounted to the first component and wherein said lever pivots said first arm to move said first arm between the extended position and the retracted position.

16. The assembly of claim 13, further comprising:

a second arm moveably mounted to the first component so that said second arm is moveable between an extended position and a retracted position;

a second wheel mounted for rotation on said second arm; and a second contact surface provided on the second component, said first and second wheels rolling along said first and second contact surfaces and separating the first component from the second component as said first and second arms are moved to the extended position.

17. The assembly of claim 16, further comprising a lever operatively associated with said first and second arms for moving said first and second arms between the extended and retracted positions.

18. The assembly of claim 17, further comprising an extension stop mounted to the first component, said extension stop engaging said lever when said first and second arms are in the extended positions, the engagement of said lever with said extension stop preventing said first and second arms from being moved beyond the extended position.

19. The assembly of claim 17, further comprising a retraction stop mounted to the first component, said retraction stop engaging said lever when said first and second arms are in the retracted positions, the engagement of said lever with said retraction stop preventing said first and second arms from being moved beyond the retracted position.

20. A method for separating a first component from a second component, comprising:

providing the first component with a wheel that is moveable with respect to the first component between a retracted position and an extended position; and moving the wheel to the extended position, the wheel contacting the second component as the wheel is moved to the extended position to separate the first component from the second component.

* * * * *